(12) United States Patent
Lalithambika et al.

(10) Patent No.: US 7,782,083 B2
(45) Date of Patent: Aug. 24, 2010

(54) TRIMMING CIRCUITS AND METHODS

(75) Inventors: Vinod A. Lalithambika, Cambridge (GB); David M. Garner, London (GB); David Robert Coulson, Comberton (GB); Zahid Ansari, Cambridgeshire (GB)

(73) Assignee: Cambridge Semiconductor Limited (GB)

( * ) Notice: Subject to any disclaimer, the term of this patent is extended or adjusted under 35 U.S.C. 154(b) by 778 days.

(21) Appl. No.: 11/639,374

(22) Filed: Dec. 14, 2006

(65) Prior Publication Data

US 2008/0143422 A1    Jun. 19, 2008

(30) Foreign Application Priority Data

Dec. 14, 2006    (GB) .................... 06248892

(51) Int. Cl.
*H03K 19/173*    (2006.01)
*G11C 29/12*    (2006.01)
*G11C 16/30*    (2006.01)

(52) U.S. Cl. .................... 326/38; 365/189.03; 365/201; 365/221

(58) Field of Classification Search ................ 327/525; 365/225.7, 189.03, 201, 221; 326/37, 38; 361/103, 104; 324/763
See application file for complete search history.

(56) References Cited

U.S. PATENT DOCUMENTS

| | | | |
|---|---|---|---|
| 5,767,732 A | 6/1998 | Lee et al. | |
| 5,838,076 A | 11/1998 | Zarrabian et al. | |
| 6,060,899 A | 5/2000 | Hamada | |
| 6,088,256 A * | 7/2000 | Worley et al. | 365/96 |
| 6,366,154 B2 | 4/2002 | Pulvirenti | |
| 6,388,853 B1 | 5/2002 | Balakrishnan et al. | |
| 6,472,897 B1 | 10/2002 | Shyr et al. | |
| 6,621,284 B2 * | 9/2003 | D'Angelo | 324/763 |
| 6,720,800 B2 | 4/2004 | Shyr et al. | |
| 6,970,394 B2 * | 11/2005 | Wu et al. | 365/225.7 |
| 7,400,483 B2 * | 7/2008 | Balakrishnan et al. | 361/103 |
| 7,539,075 B2 * | 5/2009 | Huckaby et al. | 365/226 |
| 2003/0038649 A1 | 2/2003 | D'Angelo | |

FOREIGN PATENT DOCUMENTS

| | | |
|---|---|---|
| EP | 1120828 | 8/2001 |
| EP | 1126524 | 8/2001 |

OTHER PUBLICATIONS

UK Search Report for GB 0624889.2, a corresponding UK application, dated Apr. 3, 2007 (one page).

* cited by examiner

*Primary Examiner*—Gary L Laxton
(74) *Attorney, Agent, or Firm*—Schwegman, Lundberg & Woessner, P.A.

(57) ABSTRACT

Techniques for programming trimming circuitry of a power integrated circuit without the need for separate programming pins are disclosed. According to a first aspect of the invention, there is provided a power supply controller IC with internal circuitry, a plurality of external connections, the IC further comprising trimming circuitry with no external connections to the IC other than via shared ones of the external connections. The shared external connections can comprise a first connection comprising a data input for receiving data for programming the trimming circuitry, and a second, different connection comprising a select input to select between a data receiving mode for receiving data from the data input and a programming mode for programming the trimming circuitry using the received data.

4 Claims, 7 Drawing Sheets

TRIMMING CIRCUITS AND METHODS

RELATED APPLICATION

This application claims priority under 35 U.S.C. 119 from United Kingdom Application No. 0624889.2 filed 14 Dec. 2006, which application is incorporated herein by reference.

FIELD OF THE INVENTION

This invention generally relates to circuits and methods for trimming an integrated circuit, in particular a power integrated circuit. More particularly the invention relates to techniques for programming trimming circuitry, which includes test circuitry, without the need for separate programming pins.

BACKGROUND TO THE INVENTION

Analogue integrated circuits such as integrated power supply controllers are commonly trimmed at the wafer level to correct for parameter variations due to process variations. This generally employs the use of additional trimming pads within the wafer that are not bonded out. For this reason the trimming is generally performed before packaging (when the pads are accessible) but this has the disadvantage that trimmed parameters may change after encapsulation, for example due to stresses during the packaging procedure. It would therefore be advantageous if trimming could be carried out after packaging. This should reduce the errors in trimmed parameters arising due to packaging stresses.

One technique for programming a power supply controller is described in U.S. Pat. No. 6,388,853, which describes an arrangement in which a programmable circuit connection is selected by toggling the power supply terminal of an IC ($V_{DD}$) to increment a counter and then once the desired state of the counter is reached so that the desired programmable circuit connection is selected, then the $V_{DD}$ voltage is raised to the programming voltage to programme the selected connection. A disable circuit with a programmable circuit connection is employed to prevent any further accidental programming. There is, however, a need for improved techniques for trimming analogue integrated circuits, in particular power controller integrated circuits.

Other background prior art can be found in: U.S. Pat. Nos. 6,060,899; 5,767,732; and 5,838,076.

SUMMARY OF THE INVENTION

According to a first aspect of the invention there is therefore provided a power supply controller integrated circuit (IC), the IC having internal circuitry to implement a power supply controller and a plurality of external connections including a set of connections to said power supply controller, the IC further comprising trimming circuitry having no external connections to said IC other than via shared ones of said external connections, and wherein said shared external connections comprise a first, shared external connection comprising a data input to said trimming circuitry for receiving data for programming said trimming circuitry, and a second, different shared external connection comprising a select input to said trimming circuitry to select between a data receiving mode for receiving data from said data input and a programming mode for programming said trimming circuitry using said received data.

In embodiments the power supply controller IC uses two existing low voltage functional pins of the IC for programming (as well as $V_{DD}$ and ground) but no additional external connections are required for the programming circuitry. The first shared connection enables a plurality of serial data bits to be provided to the IC for programming the trimming circuitry, and these are preferably stored in a memory such as a shift register so that the second shared connection can then be used to permanently program the stored data bits into the trimming circuitry substantially simultaneously, for example by blowing fuses or anti-fuses.

Thus in preferred embodiments the serial data is received as a combined clock and data signal which is demodulated by the trimming circuitry in order to identify the separate data bits for programming.

In some preferred embodiments the trimming circuitry has a diagnostic mode to enable the stored or programmed data bits to be read out from the integrated circuit for test, write-confirmation or other purposes. To avoid providing additional pins on the integrated circuit to enable this diagnostic mode, preferably this data is output by modulating a characteristic of a power semiconductor device incorporated within the integrated circuit, for example by switching such a device on and off.

There are many types of power semiconductor devices which may be incorporated into such a power supply controller integrated circuit, for example for power switching. These include, particularly, power MOSFETs (Metal Oxide Semiconductor Field Effect Transistors) and Insulated Gate Bipolar Transistors (IGBTs). Broadly speaking when we refer to a power device we are generally referring to devices which are suitable for operating with a voltage of greater than 100 volts and of powers greater than 1 watt.

The skilled person will appreciate that a power controller integrated circuit may or may not incorporate a power switching device and that embodiments of the techniques we describe herein may be employed whether or not the power switching device is incorporated alongside the low voltage circuitry on a single substrate. Further the skilled person will appreciate that even where the power switching device is incorporated with the control/drive circuitry in a single integrated circuit, in embodiments the power device and the low voltage circuitry may be fabricated on separate substrates and connected internally within the IC. Preferably, however, the power switching device and low voltage circuitry are fabricated on a common wafer substrate, alongside one another.

In preferred embodiments the trimming circuitry is responsive to a voltage level on the select input to select between the data receiving and programming modes and, where implemented, the diagnostic mode. Additionally or alternatively the trimming circuitry may be responsive to a voltage transition on the select input to select between these modes. In embodiments the trimming circuitry comprises a state machine and the modes are defined by different states of the state machine, selected by the voltage level and/or transitions on the select input.

In preferred embodiments the trimming circuitry comprises a plurality of fuses or anti-fuses which may be blown in order to program the trimming circuitry. The programming may define one or more trimmed parameters and/or may define one or more functions of the IC, for example an under or over voltage threshold, a current limit, a switch frequency, a temperature limit (thermal shutdown function) and the like. One of the shared external connections preferably therefore comprises a connection to receive a voltage for programming the trimming circuitry, this programming voltage being greater than a normal operational voltage of the internal circuitry used to implement the power supply controller. Preferably, therefore, the IC includes a voltage limiting or isolation circuit between this external connection and the internal circuitry so that the raised programming voltage does not significantly adversely impact the internal power supply controller circuitry.

In a related aspect the invention provides a power integrated circuit (IC), the IC comprising a package having a plurality of external connections to internal circuitry of the IC, said IC further comprising a plurality of non-volatile programmable elements for configuring the IC and programming circuitry for programming said elements, and wherein said programming circuitry shares at least two of said external connections; said programming circuitry comprising first circuitry coupled to a first one of said shared external connections, said first circuitry being configured to receive a plurality of data bits from said first shared external connection and to store said data bits in a register; and second circuitry coupled to a second one of said shared external connections, said second circuitry being configured to select one of at least two states of said programming circuitry in response to a signal on said second of said external connections, a first state in which said data bits are received and stored and a second state in which said stored data bits are used to program said non-volatile programmable elements.

Broadly, when we refer to a power integrated circuit (IC) we are referring to ICs which are suitable for use in a power application and either include a power device (as described above) or are configured for driving such a device. Where (as is preferable) the power IC includes a power device, the power device generally operates alongside low voltage circuitry which typically performs a driver and/or control function. This low voltage typically operates at a voltage of equal to or less than 20V, 10V or 5V. The low voltage circuitry is typically constructed using CMOS (Complementary Metal Oxide Semiconductor), bipolar or BiCMOS technology; the high voltage (power) circuitry or device generally employs Junction-Isolation (JI) or Semiconductor-On-Insulator (SOI) technology.

In some preferred embodiments the first circuitry includes a demodulator coupled to a shift register to store the data bits, and includes a state machine to define the first and second states. In preferred embodiments the second circuitry comprises a pair of comparators coupled to the second shared connection to define three voltage ranges, a first range for normal (non-programming) operation of the integrated circuit, and two additional ranges to define the first and second states of the programming circuitry (state machine). Preferably the second shared connection comprises a connection to receive a programming voltage for programming one or more fuses or anti-fuses of the IC, and in this case preferably third, voltage-limiting circuitry is provided between the second shared external connection and the internal circuitry of the IC, to protect the internal circuitry from the raised programming voltage. Optionally a diagnostic mode may also be implemented, this mode enabling the stored data bits to be read out from the power IC.

One risk with including programmable trimming circuitry in an IC is that this trimming circuitry could be re-programmed accidentally during operation of the integrated circuit. The inventors have recognised that in embodiments of the IC we describe one pin (the current sense pin) is always negative during normal operation, and that this observation may be used to reduce the risk of re-programming.

Thus in another aspect the invention provides an integrated circuit (IC), the IC having internal circuitry with a set of external connections and further comprising trimming circuitry for said internal circuitry, at least one connection to said trimming circuitry sharing a said external connection to said internal circuitry, wherein said IC has two operating modes, a first, normal mode during which said shared external connection is employed by said internal circuitry and a second, programming mode during which said shared external connection is used for programming said trimming circuitry, wherein in said normal operating mode said shared external connection has a first range of allowable voltage values, wherein in said programming mode said shared external connection has a second range of allowable voltage values non-overlapping with said first range of allowable voltage values, and wherein said first and second ranges of allowable voltage values have opposite polarities.

Thus, in embodiments, in the normal operating mode the shared external connection always has a first, legal polarity, say negative, and in the programming mode this shared external connection has the opposite polarity, say positive, so that the polarity used for programming is not a legal polarity state or normal operation. Thus non-overlapping legal values are defined for the internal circuitry as opposed to the trimming or programming circuitry. Preferably the shared external connection does not comprise an external power supply connection such as $V_{DD}$, and preferably the trimming circuitry lacks any dedicated external connections.

Thus in a further aspect the invention provides an integrated circuit (IC) the IC having internal circuitry with a set of external connections and further comprising trimming circuitry for said internal circuitry, at least one connection to said trimming circuitry sharing a said external connection to said internal circuitry, wherein said IC has two operating modes, a first, normal mode during which said shared external connection is employed by said internal circuitry and a second, programming mode during which said shared external connection is used for programming said trimming circuitry, wherein in said normal operating mode said shared external connection has a first range of allowable voltage values, wherein in said programming mode said shared external connection has a second range of allowable voltage values non-overlapping with said first range of allowable voltage values, and wherein said shared external connection does not comprise a said external power supply connection.

In a related aspect the invention provides a method of configuring an integrated circuit (IC) for programming using trimming circuitry, said trimming circuitry sharing an external connection of said IC with other internal circuitry of said IC, the method comprising defining a legal voltage polarity for use of said shared external connection for programming said trimming circuitry which polarity is not a legal polarity for operation of said other internal circuitry to which said shared external connection is connected.

Thus the legal voltage polarity of the external connection for programming is not a legal polarity of the connection for normal operation of the internal circuitry.

In a further aspect the invention provides an integrated circuit (IC) including a plurality of non-volatile programmable elements and a Programming Through Leads (PTL) module for programming said elements, said PTL module comprising: a first, serial data input; a demodulator coupled to said first input for demodulating clock and data signals from a serial data signal on said serial data input; a memory device coupled to said programmable elements and to said demodulator to store data demodulated from said serial data signal; a second, state select input; a state machine coupled to said state select input and to said memory device, said state machine having first and second states selectable by a signal on said second input, and wherein when said state machine is in said first state said PTL module is configured to input serial data from said first input and to store said serial data in said memory and when said state machine is in said second state said PTL module is configured to write said serial data stored in said memory to said non-volatile programmable elements.

The reference to "leads" is to be interpreted broadly and includes, for instance, types of external IC package connection including ball-type connections and LCCC (Leadless Ceramic Chip Carrier) connections.

The invention further provides a method of programming trimming circuitry of a power integrated circuit (IC), the method comprising: using a first pin of said power IC to input a plurality of serial data bits defining storing said plurality of data bits in said power IC; using a second pin of said power IC to apply a programming voltage to said power IC to program said plurality of fuses or anti-fuses substantially simultaneously.

In a still further aspect the invention provides an integrated circuit (IC), the IC having internal circuitry and including trimming circuitry for configuring said internal circuitry, said IC further having an external connection shared by said trimming circuitry and said internal circuitry, the IC including a voltage limiting circuit between said shared external connection and said trimming circuitry, wherein said voltage limiting circuit comprises a field effect transistor (FET), said FET having an input connection coupled to said shared external connection, an output connection coupled to said internal circuitry and a control connection coupled to a reference voltage level and wherein, in operation, a voltage at said output connection is limited to substantially no more than said reference voltage level.

In preferred embodiments the voltage limiting circuit comprises a single such FET. In embodiments no control circuits are employed to drive the control (gate) connection; instead in embodiments the reference voltage level comprises a power supply of the IC. The FET may be an NMOS FET and the reference voltage level may then comprise a positive power supply voltage ($V_{DD}$) of the IC.

In preferred embodiments the FET comprises a MOSFET with a body connection, and this body connection is coupled to a ground connection by a rectifier, for example a diode or diode-connected transistor. This is particularly advantageous where the shared external connection may go negative, for example in the case of a power supply controller IC where the shared connection comprises, for example, a current sense connection of the IC.

The voltage limiting circuit may be employed to limit a programming voltage for a fuse or anti-fuse to no greater than a power supply voltage of the internal circuitry of the IC.

There is also provided a method of isolating a programming voltage for programming a plurality of fuses or anti-fuses of an integrated circuit (IC) from lower voltage internal circuitry of the IC sharing a connection to said IC used to apply said programming voltage, the method comprising using a field effect transistor (FET) to couple said shared connection to said lower voltage internal circuitry, said FET having a drain connection coupled to said shared connection, a source connection coupled to said lower voltage internal circuitry, and a gate connection coupled to a voltage limit reference such that a voltage at said source connection is inhibited from rising above said voltage limit reference.

Preferably the gate connection is coupled to a power supply connection of the integrated circuit so that the voltage at the source is inhibited from rising above a power supply voltage of the IC.

In a still further aspect the invention provides a power integrated circuit (IC), the IC having internal circuitry including a power device coupled to an external connection of said IC, and trimming circuitry for configuring said internal circuitry, said trimming circuitry including a plurality of non-volatile programmable elements, and wherein said IC has a diagnostic mode during which data stored in said plurality of non-volatile programmable elements is serially output from said IC by using said power device as a data output device to make said stored data available on said external connection.

BRIEF DESCRIPTION OF THE DRAWINGS

These and other aspects of the invention will now be further described, by way of example only, with reference to the accompanying drawings in which.

DETAILED DESCRIPTION OF PREFERRED EMBODIMENTS

Figure 1A:
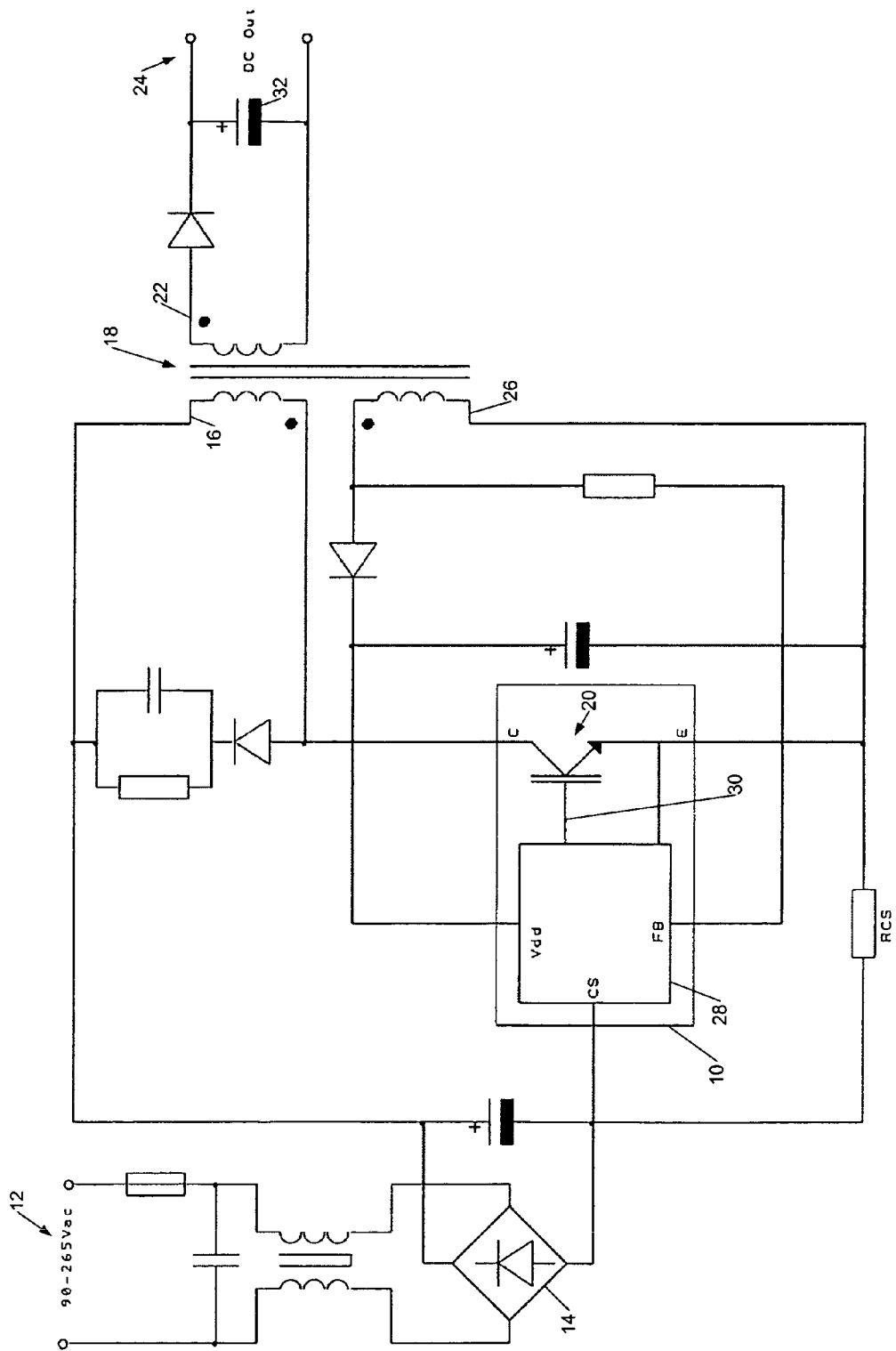
FIGS. 1a and 1b show, respectively, a switch mode power supply circuit incorporating a power supply controller IC suitable for implementing a trimming circuit according to an embodiment of the invention, and a block diagram of a switch mode power supply controller integrated circuit including a power switching device and incorporating a trimming circuit according to an embodiment of the invention.

Referring now to FIG. 1a, this shows an example of a switch mode power supply circuit incorporating a power supply controller IC 10 of a type suitable for implementing embodiments of the invention. As illustrated, the IC includes a power switching device 20 (here an Insulated Gate Bipolar Transistor, IGBT) although it will be appreciated that this may be in a separate package to the IC. The power supply comprises an AC mains input coupled to a bridge rectifier 14 to provide a DC supply to the input side of the power supply. This DC supply is switched across a primary winding 16 of a transformer 18 by means of IGBT 20. A secondary winding 22 of transformer 18 provides an AC output voltage which is rectified to provide a DC output 24, and an auxiliary winding 26 provides a feedback signal voltage proportional to the voltage on secondary winding 22. This feedback signal provides an input (FB) to a control system 28, powered ($V_{DD}$) by the rectified mains.

A Current Sense (CS) input to the control system is also provided, measuring the voltage drop across resistor RCS to a ground terminal (E). Noting the direction of current flow (towards the negative end of the bridge rectifier 14), it will be appreciated that CS is below the ground level voltage, typically by less than 0.5V, for example by 0.2V to 0.3V. The control system provides a drive output 30 to the power switching device 20, modulating pulse width and/or pulse frequency to regulate the transfer of power through transformer 18, and hence the voltage of DC output 24. The power switch 20 and controller 28 may be combined on a single power integrated circuit.

Figure 1B:
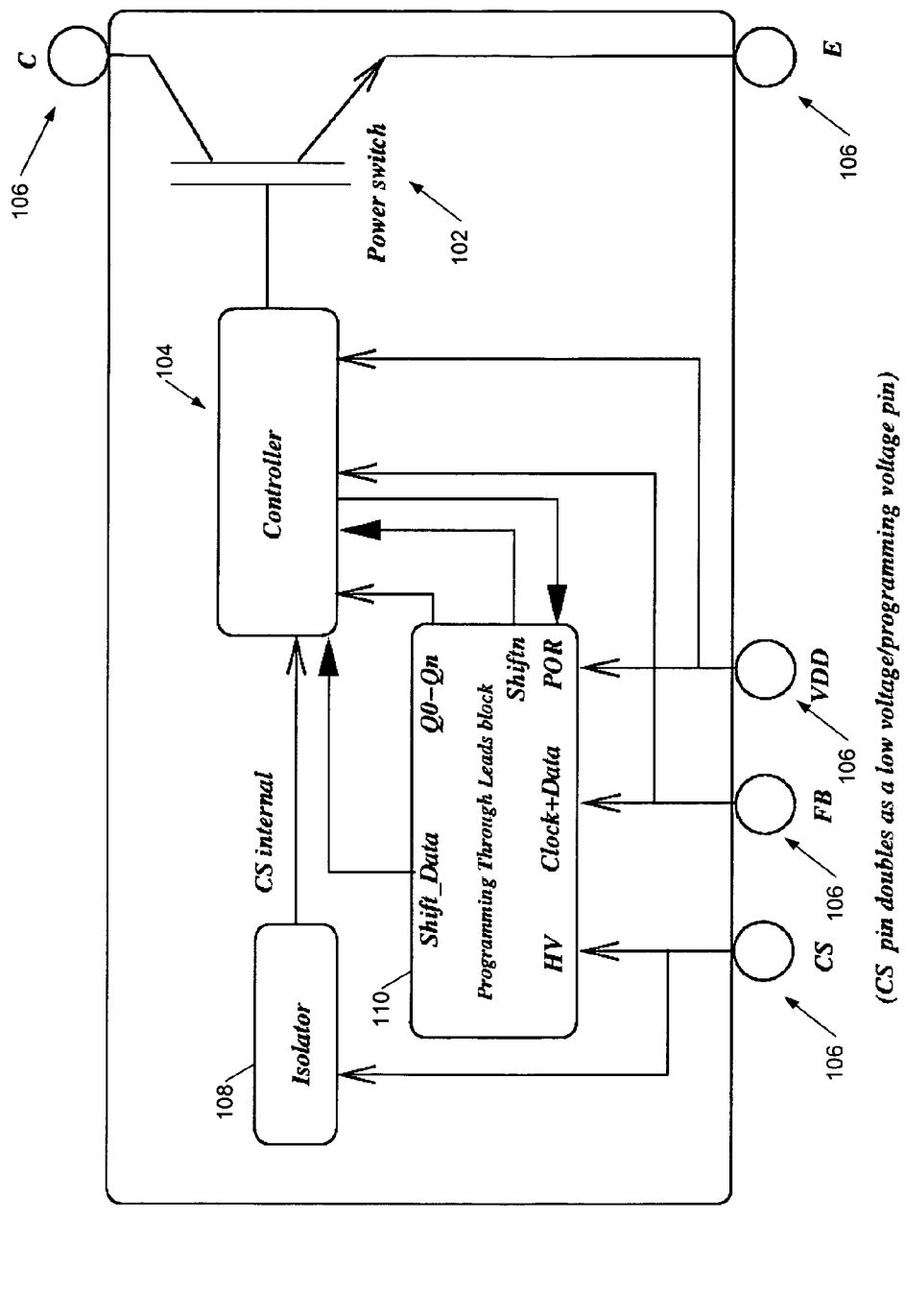

Referring now to FIG. 1b, this shows a block diagram of a power supply controller integrated circuit 100 incorporating a power switching device 102 driven by a controller 104, the IC 100 having a plurality of external connections 106 to the controller 104 and power switch 102, typically pins of the power IC. In the illustrated example the external connections comprise a high voltage pin (C), two power supply pins ($V_{DD}$ and ground (E)), typically at 5V and 0V, and two low voltage control pins (CS—current sense, and FB—feedback) again typically carrying voltages in the range 0V to 5V. The IC 100 is suitable for use in the circuit of FIG. 1a.

The IC 100 also incorporates trimming circuitry, here comprising a Programming Through Leads (PTL) block 110 and an isolator 108; these share two of the low voltage control pins, CS and FB, of the IC 100, as well as the power and ground pins. (In the example of FIG. 1b the E terminal of the power switch serves as ground, although this is not explicitly shown; in other embodiments a separate ground connection may be provided).

In the illustrated embodiment the FB pin provides a clock and data signal the PTL block 110 and the CS pin provides an increased supply voltage for programming the fuses (or anti-fuses) of the PTL block. This programming voltage is higher than the usual power supply voltage, for example around 10V. Since the current sense pin is also connected to low voltage circuits in the controller 104, an "isolator" block 108 is provided to provide "isolation" (voltage limiting) between this pin and the internal low voltage circuits during programming. These low voltage circuits, in one embodiment, had a maximum voltage of slightly higher than $V_{DD}$ (5.5V); the function of the isolator is to limit to this maximum voltage but without significantly affecting the functionality of this control pin during normal operation.

In preferred embodiments the voltage on the CS pin also determines the various states of a state machine that controls the PTL block; this is described further below.

The FB pin provides data, clock and control signals for the PTL block 110 to enable programming and diagnostics. A coding scheme is used for combining the clock and data, and a demodulator is employed to decode this coding scheme.

From the foregoing discussion it can be seen that the trimming circuit employs only the available low voltage pins of the integrated circuit 100—separate programming pins need not be provided. More particularly, two existing low voltage functional pins of the IC are used for programming. The voltage level on one of these pins determines the state of the state machine that controls the programming of the fuses. The programming voltage (for example 10V) is applied through this low voltage pin (for example having a normal range 0V to 5V). An isolator 108 is used to isolate the relatively higher programming voltage from the low voltage internal circuits; as described later this uses a single transistor and, in embodiments, does not require any control circuits. The second low voltage pin is used for providing both clock and data (and control) signals that are employed for programming (and diagnostics). The clock and data are combined through the use of a coding and decoding scheme.

The power integrated circuit 100 is therefore provided with test and trim circuitry that can be programmed through leads after packaging. Programming employs the existing low voltage pins without the need for any additional programming pins on the IC. Moreover the isolator ensures that the function of the pin used for higher voltage programming is not affected during normal operation of the IC. The isolator may comprise a single switch and, in embodiments, does not require any control circuits to drive its control connection.

Continuing to refer to FIG. 1b, the programmed data in the fuses (or anti-fuses) is provided to the controller by a set of parallel outputs Q0-Qn from the PTL block 110 to the controller; this data is also able to be provided by the PTL block 110 in a serial form from an output Shiftn, for output using the power switch 102 for diagnostic purposes. The controller 104 provides a Power On Reset (POR) signal to the PTL block 110.

Figure 2:
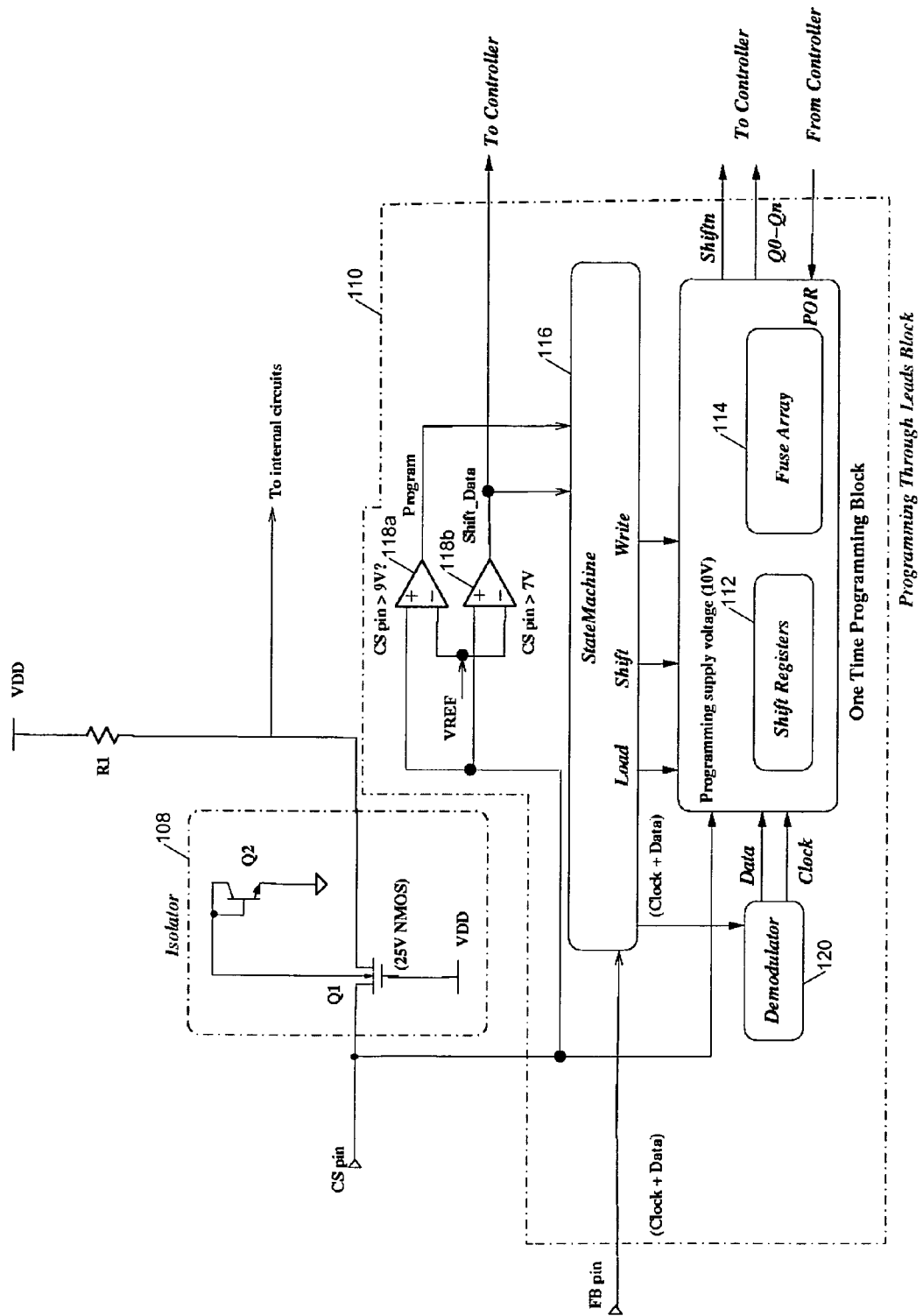
FIG. 2 shows a detailed circuit diagram of an embodiment of the trimming circuit of FIG. 1b, in particular illustrating the isolator and Programming Through Leads (PTL) block.

Referring now to FIG. 2, this shows details of the PTL block 110 and isolator 108 of FIG. 1b. In outline the PTL block 110 includes a shift register 112, a fuse array 114, a state machine 116, a pair of comparators, 118a, b, and decoder/demodulator 120.

Example configurations of the fuses will be well known to the skilled person. They include conventional fuses, which change from a low resistance to a high resistance on programming, and anti-fuses which may comprise, for example a Zener diode which presents a high resistance until it is blown by application of a sufficiently high voltage that it is permanently programmed into a low-resistance state. After a Power On Reset (POR) from the controller the data in the fuse array 114 is available at the output of the shift registers (Q0-Qn).

The shift registers 112 and array 114 make up a One-Time Programming block which receives a programming supply voltage (10V) from the CS pin, load, shift and write signals from state machine 116, and clock and data signals from demodulator 120. The combined clock and data signal is, as illustrated, received by demodulator 120 from the FB pin via the state machine 116, although this data could be received directly from the FB pin.

The two comparators 118a, b each have an input coupled to the CS pin, and a second input coupled to a reference voltage (VREF), in this example common to both comparators. The first comparator 118a determines whether the voltage on the CS pin is greater than 9V, the second comparator 118b whether the voltage on the CS pin is greater than 7V, so in this example VREF is shown to be 8V.

The second comparator 118b provides a Shift_Data signal output to the state machine 116 and controller 104; this signal goes high if the CS pin is greater than 7V. This takes the state machine on to the "shift" state. During the shift state the combined clock and data signal is applied through the FB pin and the demodulator 120 demodulates this signal and separates the data from the clock. The data is then shifted into the shift registers 112.

The first comparator 118a provides a Program output signal to state machine 116; if the voltage on the CS pin is greater than 9V this Program signal goes high which puts the state machine into a "Program" state. During the program state the fuses in the fuse array 114 are programmed according to the data stored in the shift register 112. The programming of the fuses is performed only when a write signal is applied through the FB pin. The duration of the write signal controls the programming time.

Further details of the state machine are described with reference to FIG. 3 below.

Referring now to the voltage limiting or isolator block 108, this circuit is connected between the CS pin and the internal circuits of the controller 104. The circuit comprises a single, relatively high voltage (25V) NMOS transistor Q1 connected in such a way that no control circuit is required to turn the gate on and off. More particularly the gate of transistor Q1 is connected to the supply voltage ($V_{DD}$) in such a way that the maximum voltage seen by the internal circuits is $V_{DD}$ (for example 5V) when the programming voltage (for example 10V) is applied to the programming pin (CS pin).

The drain of transistor Q1 is connected to the CS pin and the source to the internal circuits to be protected. In operation, should the voltage on the source rise towards that on the gate ($V_{DD}$) the drain-source current will fall, to substantially 0 when the gate—source voltage is 0, thus automatically switching off. It will be appreciated that transistor Q1 is an enhancement mode device and may have either an N or a P-type channel.

The body connection of the transistor is preferably connected to a rectifier, here provided by diode-connected bipolar transistor Q2. This inhibits the body diode of Q1 from conducting when the CS pin is driven negative during normal operation. During normal operation the transistor Q1 acts as a pass transistor; the width of Q1 is preferably chosen such that the voltage drop across this transistor is negligible during normal operation so that the normal functionality of the CS pin (that is, when it is not being used for programming) is not substantially affected.

Referring now to FIG. 3, this shows a timing diagram defining the function of the state machine 116 of FIG. 2.

Referring first to the $V_{DD}$ trace, initially the power supply of the IC is ramped up to 5V, which brings the One-Time Programming block of FIG. 2 out of the reset state—that is a Power On Reset (POR) occurs. This POR also loads the state of the fuses in the fuse array 114 into the shift registers 112 within the One-Time Programming block.

As shown in the timing diagram, the programming is performed in two phases, one to shift the data, and a second to program the fuses.

Referring to the CS signal, applying 7V to the CS pin asserts the Shift_Data signal and puts the PTL block 110, more particularly the state machine 116, into a Shift_Data state. In this state the data for programming the fuses is provided on the FB pin, as shown. During this period the Shift output of the state machine 116 is asserted, the Write output is de-asserted and the Load output is de-asserted.

The voltage on the CS pin is then raised to 10V, asserting the Program signal which puts the PTL block 110, more particularly the state machine 116, into a program state. Whilst in the program state a write signal used for programming is provided through the FB pin; this write pulse has a duration which determines the programming time, for example 3 microseconds as illustrated. It can be seen that the Write output of the state machine 116 corresponds to the write pulse on the FB pin during this state, whilst the Shift and Load outputs of the state machine are de-asserted. During the program phase a write signal is sent to a fuse if there is a corresponding logic 1 stored in the shift registers 112.

Figure 3A:
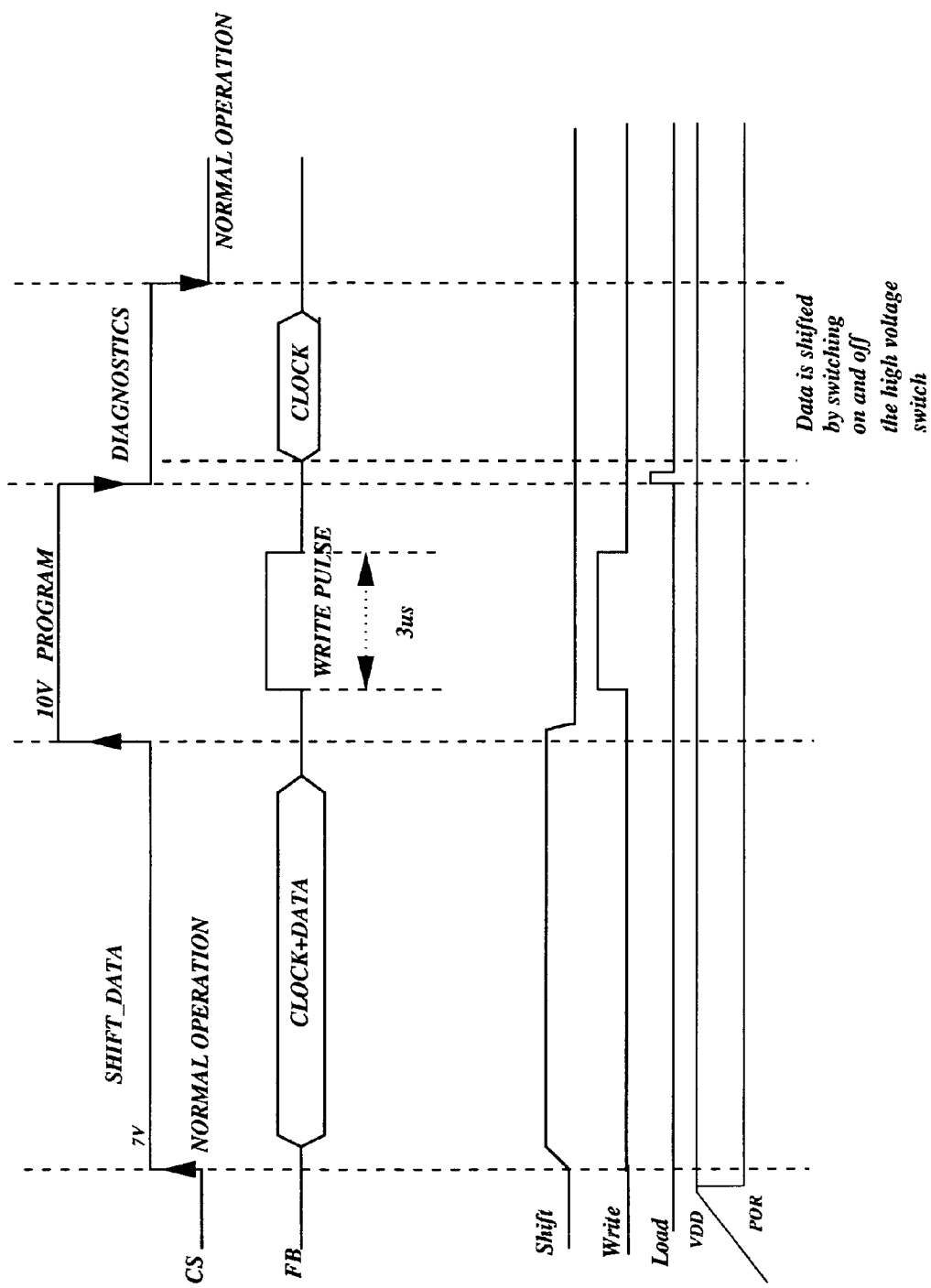
FIGS. 3a and 3b show, respectively, a timing diagram for a state machine of the PTL block of FIG. 2, and a state diagram for the state machine.

In preferred embodiments bringing the voltage on the CS pin down from 10V to 7V puts the PTL block, more particularly the state machine 116 into a diagnostic state. During this state or mode, if a clock signal is provided through the FB pin then the data in the fuses and/or shift register is pushed to the control terminal of the power switching device 102 by the controller, thus switching the power device on and off. Thus the data may be read out by monitoring the switching on and off of the high voltage switch. Referring to FIG. 3a, it can be seen that on initiation of the diagnostics phase the Load output of the state machine 116 is pulsed whilst the Shift and Write outputs are de-asserted.

The state machine 116 of FIG. 2 is configured to implement the functions described by the timing diagram of FIG. 3a using techniques which are well known to those skilled in the art. Thus, for example, one or more registers may be employed to store state variables, combinatorial logic may be employed to determine state transitions, and further combinatorial logic may be employed to provide the Load Shift and Write outputs.

Figure 3B:
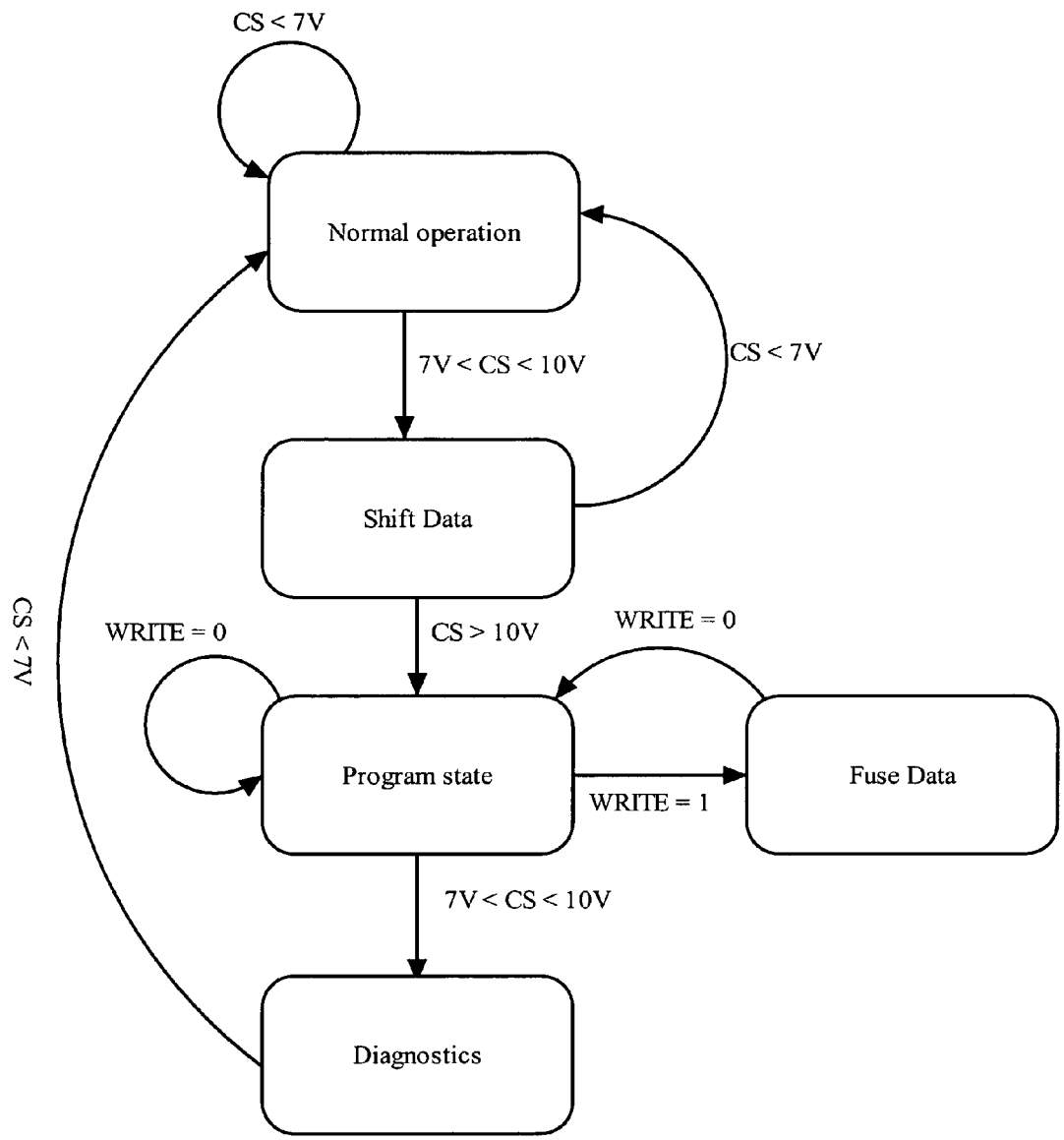

FIG. 3b shows a state diagram of the state machine.

Figure 4:
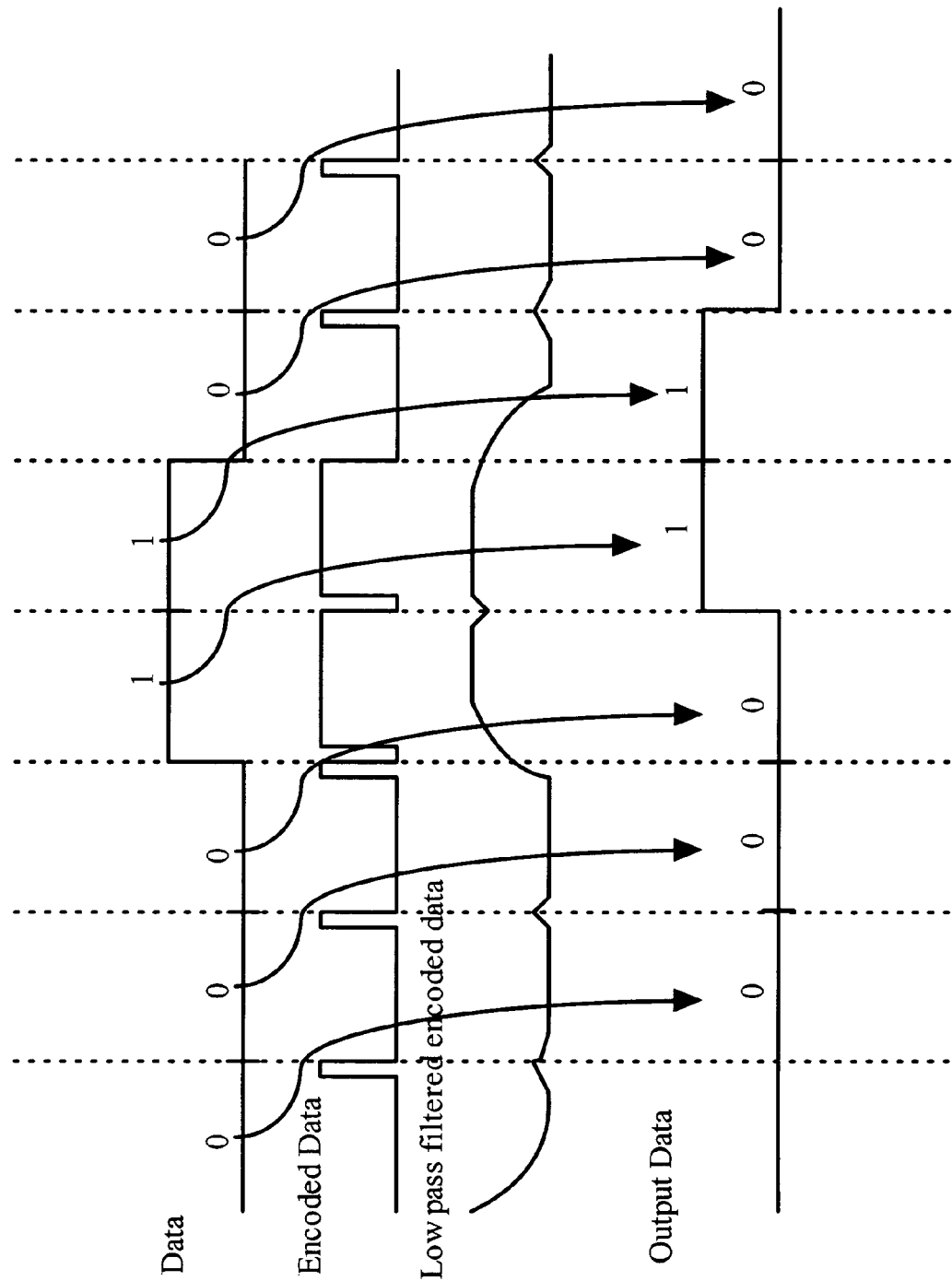
FIG. 4 shows waveforms illustrating a coding scheme for combining clock and data signals to provide an input to the PTL block of FIG. 1b.

Referring now to FIG. 4, this shows waveforms illustrating a coding scheme for combining clock and data for input to the PTL block 110 as described above. From top to bottom in FIG. 4 the traces show: the input data, the combined clock and data signal (encoded data), the encoded data signal after low-pass filtering to recover the data, and the output data. Data sampling times are indicated by vertical dashed lines in FIG. 4. Data is sampled at every high to low transition and the combined clock and data signal is configured to generate such a transition for every data bit. The skilled person will understand that there are many ways in which such a combined clock and data signal may be generated, for example using logic gates, and/or a microcontroller, and/or a sequence generator.

It can be seen that, broadly speaking, a short clock pulse is provided for each data bit, to enable the clock to be extracted. However because the clock pulse is short, for example less than 0.5, 0.2 or 0.1 of the duration of a data bit, the data can be extracted by low-pass filtering.

Figure 5:
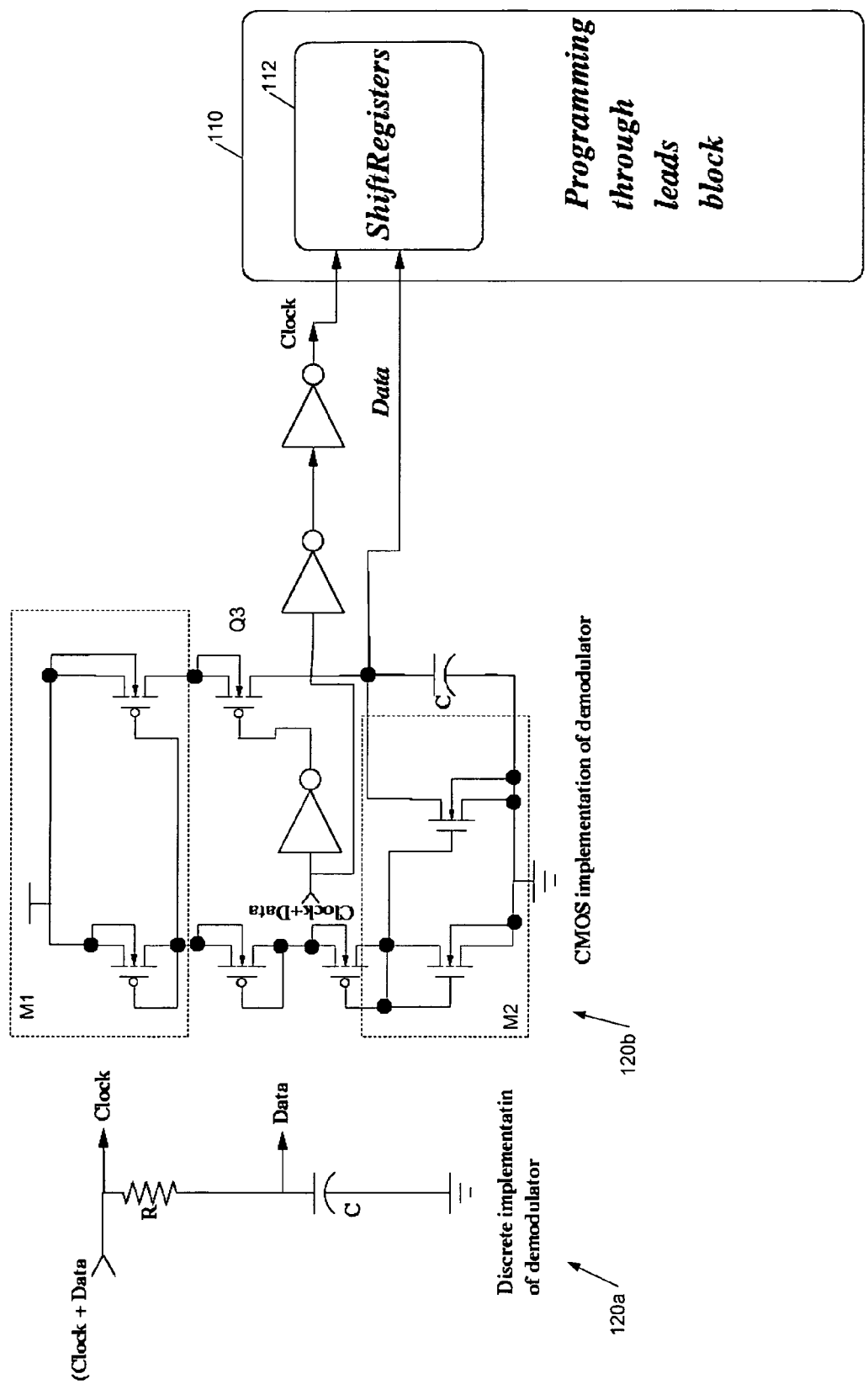
FIG. 5 shows circuit diagrams of discrete and CMOS implementations of a demodulator to demodulate the clock and data signals shown in FIG. 4.

FIG. 5 shows two example implementations of the demodulator 120 of FIG. 2, a discrete implementation 120a and a CMOS implementation 120b. The discrete implementation comprises RC filter with data output from the RC junction. The CMOS implementation comprises a pair of current mirrors M1, M2, the current mirrors having a common input so that each generates the same output current. A transistor Q3, when on, connects the outputs of M1 and M2 so that the voltage on capacitor C tends towards a midpoint voltage of the supply rails or, when Q3 is off, tends towards zero pulled low by M2.

Broadly speaking we have described techniques for using the low voltage pins of an integrated power supply controller for programming a trimming circuit to define one or more trimmed parameters or functions of the IC. Since a trimming circuit generally employs a voltage of around 7V to 10V for burning the fuses or anti-fuses to allow lower voltage pins (0V to 5V in the above-described example) to be employed, a voltage limiting circuit is employed between the higher trimming voltage and the lower voltage internal circuits. This is configured so that it does not substantially affect the functionality of the relevant pin during normal operation and, in particular, is achieved using a single transistor specified for operation at the programming voltage without, however, needing to employ a control circuit to turn the gate on or off. In embodiments trimming is achieved using two low voltage pins of a power IC, one defining the state of a state machine that controls the programming of the trimming circuits (the voltage level determining the state), this pin also providing the programming voltage. The second low voltage pin is employed to receive data and clock signals during a read state and, during a write state, to receive a signal defining a write duration for burning the fuses or anti-fuses. Among other things this enables parameters of the IC to be trimmed after packaging, which facilitates compensating for shifts in such parameters during packaging.

No doubt many other effective alternatives will occur to the skilled person. It will be understood that the invention is not limited to the described embodiments and encompasses modifications apparent to those skilled in the art lying within the spirit and scope of the claims appended hereto.

We claim:

1. An integrated circuit (IC) including a plurality of non-volatile programmable elements and a Programming Through Leads (PTL) module for programming said elements, said PTL module comprising:

a first, serial data input;

a demodulator coupled to said first input for demodulating clock and data signals from a serial data signal on said serial data input;

a memory device coupled to said programmable elements and to said demodulator to store data demodulated from said serial data signal;

a second, state select input;

a state machine coupled to said state select input and to said memory device, said state machine having first and second states selectable by a signal on said second input, and wherein when said state machine is in said first state said PTL module is configured to input serial data from said first input and to store said serial data in said memory and when said state machine is in said second state said PTL module is configured to write said serial data stored in said memory to said non-volatile programmable elements.

2. An IC as claimed in claim 1 further comprising a voltage limiting or isolation circuit having an input coupled to said state select input and having an output for connection to further circuitry within said IC.

3. An IC as claimed in claim 1 wherein said state machine has a third state selectable by said signal on said state select input, said third state comprising a diagnostic state in which said stored data is output from said PTL module.

4. An IC as claimed in claim 1 wherein said state machine states are selectable by a voltage level on said state select input.

* * * * *